(12) United States Patent
Reiter et al.

(10) Patent No.: US 11,502,064 B2
(45) Date of Patent: Nov. 15, 2022

(54) POWER SEMICONDUCTOR MODULE HAVING A CURRENT SENSOR MODULE FIXED WITH POTTING MATERIAL

(71) Applicant: Infineon Technologies AG, Neubiberg (DE)

(72) Inventors: Tomas Manuel Reiter, Munich (DE); Christoph Koch, Salzkotten (DE); Mark Nils Muenzer, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/177,395

(22) Filed: Feb. 17, 2021

(65) Prior Publication Data
US 2022/0262773 A1    Aug. 18, 2022

(51) Int. Cl.
*H01L 23/057* (2006.01)
*H01L 23/50* (2006.01)
*H01L 27/06* (2006.01)
*H01L 25/07* (2006.01)
*H01L 43/06* (2006.01)
*H02P 27/06* (2006.01)
*H01L 21/48* (2006.01)
*H01L 25/00* (2006.01)

(52) U.S. Cl.
CPC ........ *H01L 25/072* (2013.01); *H01L 21/4817* (2013.01); *H01L 23/057* (2013.01); *H01L 23/50* (2013.01); *H01L 25/50* (2013.01); *H01L 43/06* (2013.01); *H02P 27/06* (2013.01)

(58) Field of Classification Search
CPC ..... H01L 25/072; H01L 25/50; H01L 23/057; H01L 23/50; H01L 43/06; H02P 27/06
See application file for complete search history.

(56) References Cited

U.S. PATENT DOCUMENTS

| | | | |
|---|---|---|---|
| 2013/0015468 A1* | 1/2013 | Kikuchi | H01L 23/36 257/77 |
| 2016/0104651 A1* | 4/2016 | Asada | H01L 23/3735 361/783 |
| 2017/0069561 A1* | 3/2017 | Krugmann | H01L 23/04 |
| 2020/0194542 A1* | 6/2020 | Alapati | H01L 23/642 |
| 2021/0343620 A1* | 11/2021 | Yao | H01L 25/072 |

* cited by examiner

*Primary Examiner* — Omar F Mojaddedi
(74) *Attorney, Agent, or Firm* — Murphy, Bilak & Homiller, PLLC

(57) ABSTRACT

Described is a power semiconductor module that includes: a frame made of an electrically insulative material; a first substrate seated in the frame; a plurality of power semiconductor dies attached to the first substrate; a plurality of signal pins attached to the first substrate and electrically connected to the power semiconductor dies; a busbar extending from the first substrate through a side face of the frame; a current sensor module seated in a receptacle of the frame in sensing proximity of the busbar, the current sensor module including a current sensor attached to a circuit board; and a potting material fixing the current sensor module to the frame such that no air gap is present between the current sensor and the busbar. The potting material contacts the frame and the current sensor. Methods of producing the power semiconductor module are also described.

9 Claims, 16 Drawing Sheets

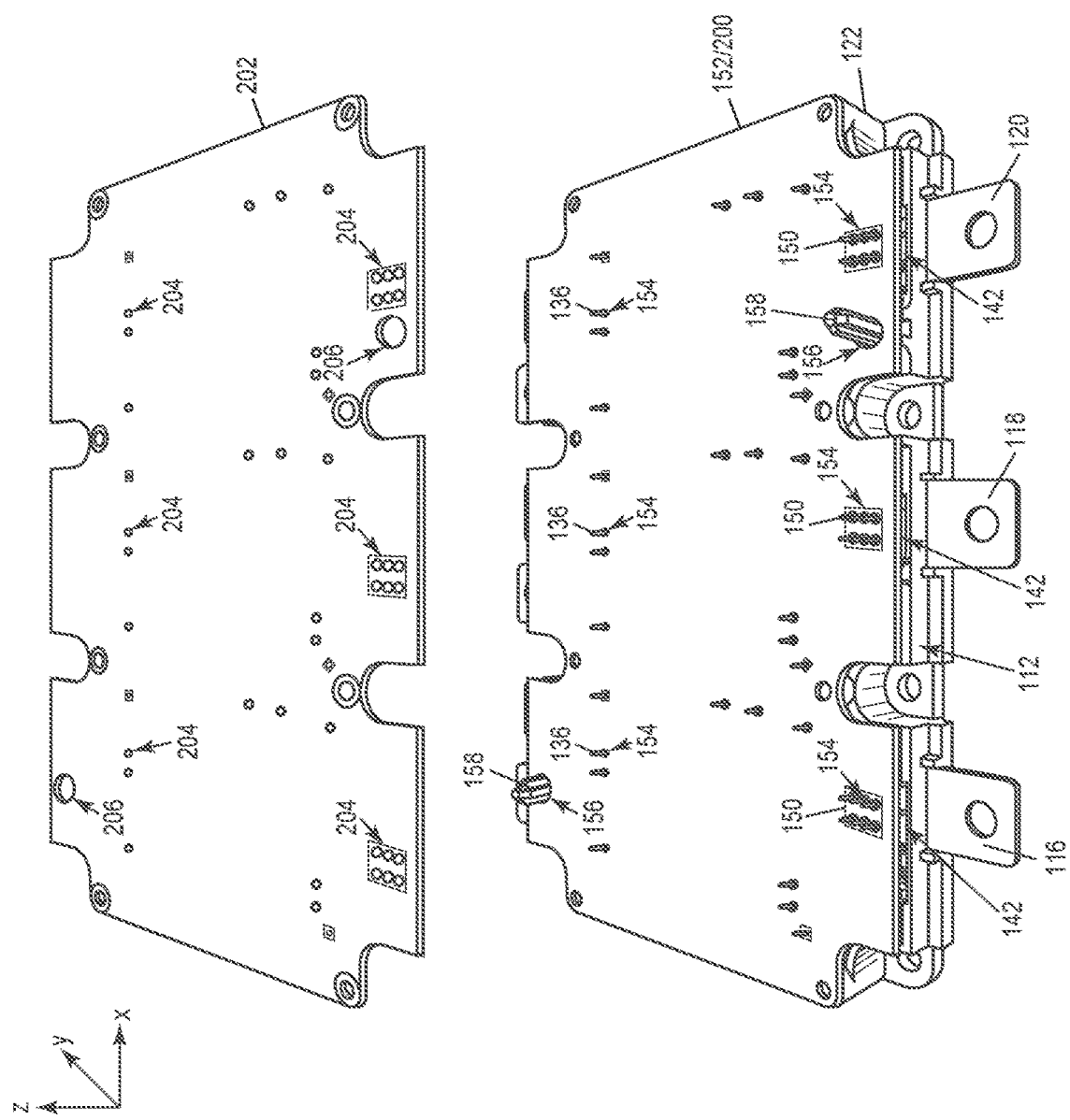

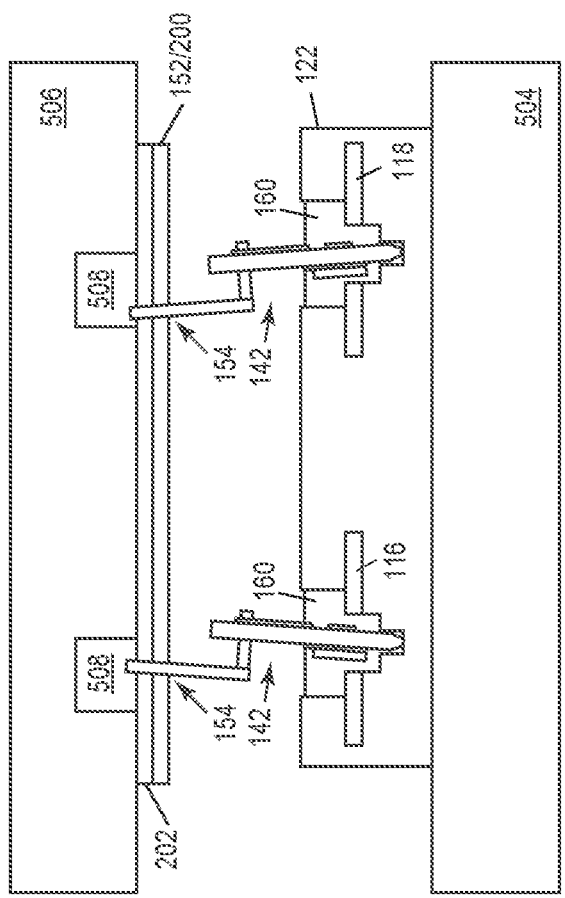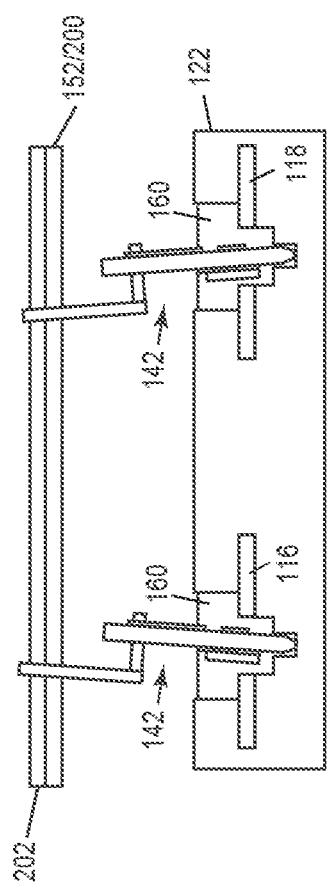
Figure 6C
Figure 6D

POWER SEMICONDUCTOR MODULE HAVING A CURRENT SENSOR MODULE FIXED WITH POTTING MATERIAL

BACKGROUND

In-phase current sensors may be used in high power drive applications to determine phase currents delivered by a power module to, for example, an electric motor. One implementation of such an in-phase current sensor uses a core-based principle of magnetic current sensing. Typically, a core-based in-phase current sensor is a magnetic sensor that implements a field concentrator (e.g., an iron core wrapped around a current rail) to concentrate a magnetic field produced by a current flowing through the current rail onto a magnetic sensing element such that a measurement can be obtained. Another implementation of an in-phase current sensor uses a core-less principle of magnetic current sensing. Typically, a core-less in phase current sensor is a magnetic sensor that implements one or more sensing elements in proximity to a current rail such that a measurement can be obtained based on a magnetic field produced by a current flowing through the current rail as sensed by the one or more of sensing elements. Such an in-phase current sensor may be used, for example, in a direct current to alternating current (DC/AC) inverter, a DC/DC converter, an AC/DC converter, a DC/AC converter, an AC/AC converter, or the like.

SUMMARY

According to an embodiment of a power semiconductor module, the power semiconductor module comprises: a frame comprising an electrically insulative material; a first substrate seated in the frame; a plurality of power semiconductor dies attached to the first substrate; a plurality of signal pins attached to the first substrate and electrically connected to the power semiconductor dies; a busbar extending from the first substrate through a side face of the frame; a current sensor module seated in a receptacle of the frame in sensing proximity of the busbar, the current sensor module comprising a current sensor attached to a circuit board; and a potting material fixing the current sensor module to the frame such that no air gap is present between the current sensor and the busbar, wherein the potting material contacts the frame and the current sensor.

According to an embodiment of a method of producing a power semiconductor module, the method comprises: attaching a plurality of power semiconductor dies to a first substrate; attaching a plurality of signal pins to the first substrate and that are electrically connected to the power semiconductor dies; seating the first substrate in a frame that comprises an electrically insulative material and such that a busbar extends from the first substrate through a side face of the frame; seating a current sensor module in a receptacle of the frame in sensing proximity of the busbar, the current sensor module comprising a current sensor attached to a circuit board; and fixing the current sensor module to the frame with a potting material such that no air gap is present between the current sensor and the busbar, wherein the potting material contacts the frame and the current sensor.

According to another embodiment of a method of producing a power semiconductor module, the method comprises: attaching a plurality of power semiconductor dies to one or more substrates, the power semiconductor dies forming a multi-phase inverter; attaching a plurality of signal pins to the one or more substrates and that are electrically connected to the power semiconductor dies; seating the one or more substrates in a frame that comprises an electrically insulative material and such that a busbar for each phase of the multi-phase inverter extends through a side face of the frame; seating a plurality of current sensor modules in receptacles of the frame, each current sensor module being in sensing proximity of one of the busbars and comprising a current sensor attached to a circuit board; and fixing the current sensor modules to the frame with a potting material such that no air gap is present between each current sensor and the corresponding busbar, wherein the potting material contacts the frame and the current sensors.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A and 2B illustrate side perspective views of another embodiment of producing a power semiconductor module having current sensor modules fixed to the module frame.

FIGS. 6A through 6D illustrate cross-sectional views of another embodiment of producing a power semiconductor module having current sensor modules fixed to the module frame.

DETAILED DESCRIPTION

The embodiments described herein provide a power semiconductor module and integration method of producing a module-integrated current sensor system. The embodiments described herein avoid sensor over-molding processes by using a gauge for sensor placement and fixing, allowing for tight (small) signal-to-sensor pin tolerances. Also, air gaps between the current sensor and busbar being sensed are avoided which ensures high reliability for isolation and partial discharge. Furthermore, tooling efforts in production are minimized as standard equipment and manufacturing processes can be reused.

Described next, with reference to the figures, are exemplary embodiments of the power semiconductor module and integration method of producing a module-integrated current sensor system.

FIGS. 1A through 1E illustrate an embodiment of producing a power semiconductor module. The power semiconductor module may be designed, for example, for use as a DC/AC inverter, a DC/DC converter, an AC/DC converter, a DC/AC converter, an AC/AC converter, or the like.

Figure 1A:
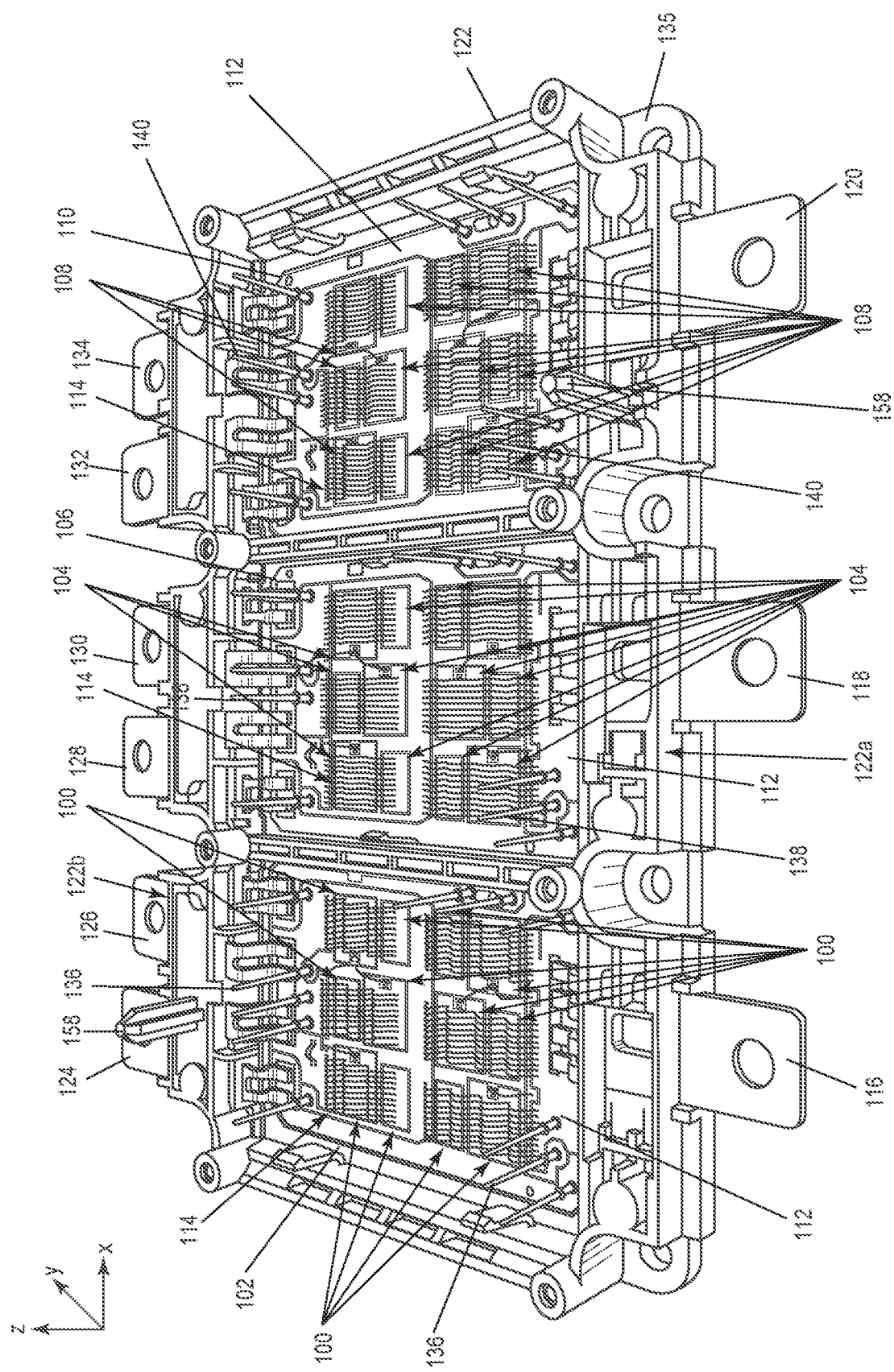
FIGS. 1A through 1E illustrate side perspective views of an embodiment of producing a power semiconductor module having current sensor modules fixed to the module frame.

In FIG. 1A, a plurality of first power semiconductor dies 100 are attached to a first substrate 102. Depending on the application for which the power semiconductor module is designed, additional power semiconductor dies may be attached to one or more additional substrates. For example, in the case of a 3-phase inverter or converter, the power semiconductor module may further include a plurality of second power semiconductor dies 104 attached to a second substrate 106 and a plurality of third power semiconductor dies 108 attached to a third substrate 110.

Each substrate 102, 106, 110 may be a DCB (direct copper bonded) substrate, an AMB (active metal brazed) substrate, an IMS (insulated metal substrate), etc. In each case, the substrates 102, 106, 110 may have a patterned metallized surface 112 that provides part of the electrical interconnections between the semiconductor dies 100, 104, 108 of the same group. Each group of semiconductor dies 100, 104, 108 may be electrically interconnected, e.g., via bond wires 114 and the patterned metallized surface 112 of the corresponding substrate 102, 106, 110 to form a half bridge also commonly referred to as H-bridge.

In the example shown in FIG. 1A, the power semiconductor module is designed for use as a 3-phase inverter and 3 half bridges are realized by the respective groups of semiconductor dies 100, 104, 108. More than one semiconductor die 100, 104, 108 from the same group may be coupled in parallel to provide higher current handling capability. Each half bridge has a phase output that is electrically coupled to a corresponding phase busbar 116, 118, 120 which provides input or output power, depending on the application in which the power semiconductor module is used. Each phase busbar 116, 118, 120 extends from the corresponding substrate 102, 106, 110 through a side face 122*a* of a frame 122 in which the substrates 102, 106, 110 are seated. The frame 122 comprises an electrically insulative material such as plastic. Respective supply (voltage) busbars 124/126, 128/130, 132/134 extend through a different side face 122*b* of the frame 122 and provide a voltage supply to the corresponding groups of semiconductor dies 100, 104, 108. Ground reference point may be provided via a baseplate 135 to which the frame 122 may be attached. The baseplate 135 may be attached to a cooler (not shown) also on ground.

The type and number of semiconductor dies 100, 104, 108 may depend on the application for which the power semiconductor module is designed. For example, the semiconductor dies 100, 104, 108 may be power MOSFET (metal-oxide-semiconductor field-effect transistor) dies, HEMT (high-electron mobility transistor) dies, IGBT (insulated gate bipolar transistor) dies, power diode dies, etc.

In each case, respective signal pins 136, 138, 140 are attached to each substrate 102, 106, 110 and are electrically connected to the corresponding group of power semiconductor dies 100, 104, 108, e.g., via the patterned metallized surface 112 of the corresponding substrate 102, 106, 110 and one or more bond wires 114. The signal pins 136, 138, 140 provide control signalling such as gate signals to the respective groups of power semiconductor dies 100, 104, 108. According to the embodiment illustrated in FIG. 1A, the signal pins 136, 138, 140 vertically extend away from the respective substrates 102, 106, 110.

Figure 1B:
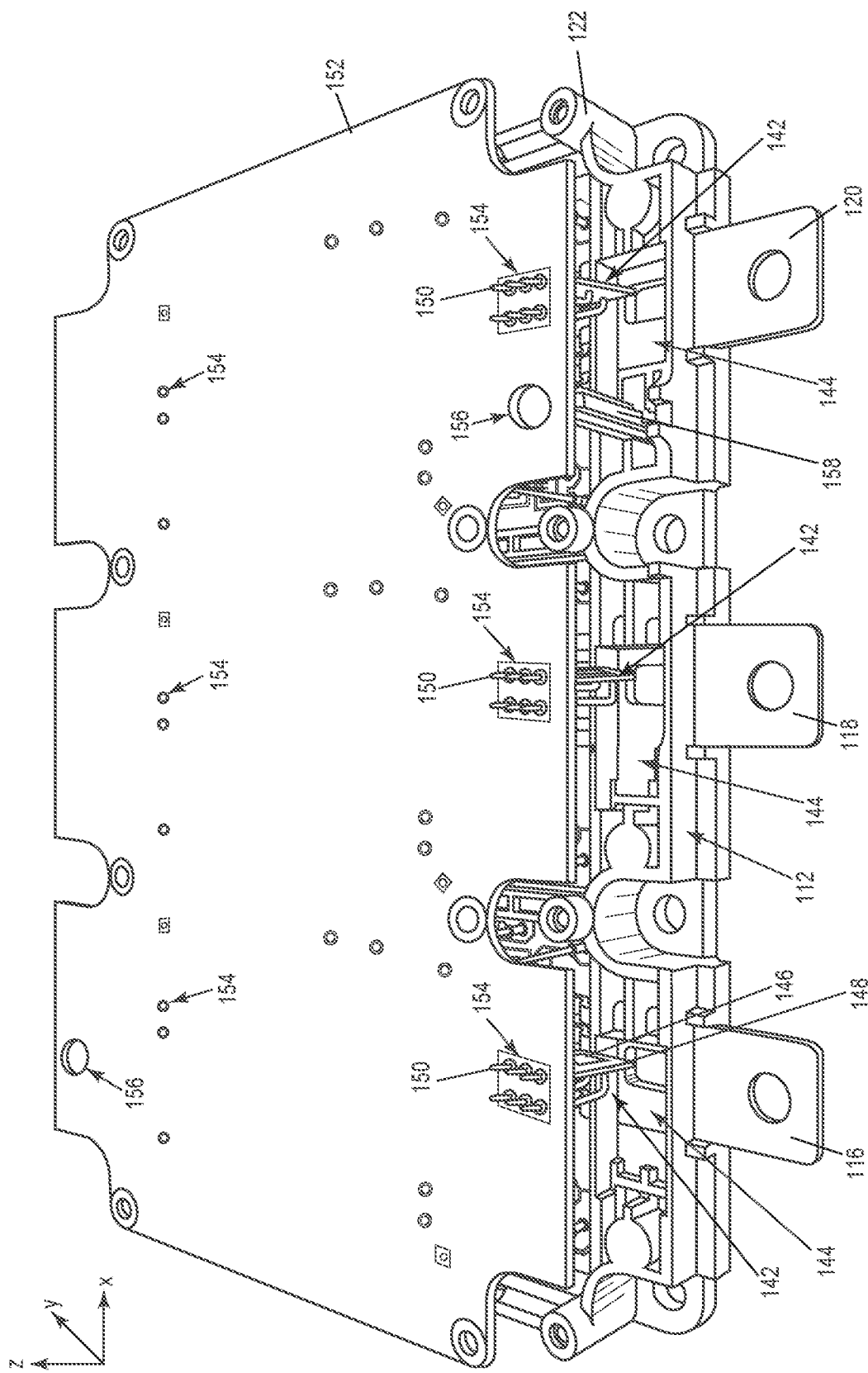
Figure 1C:
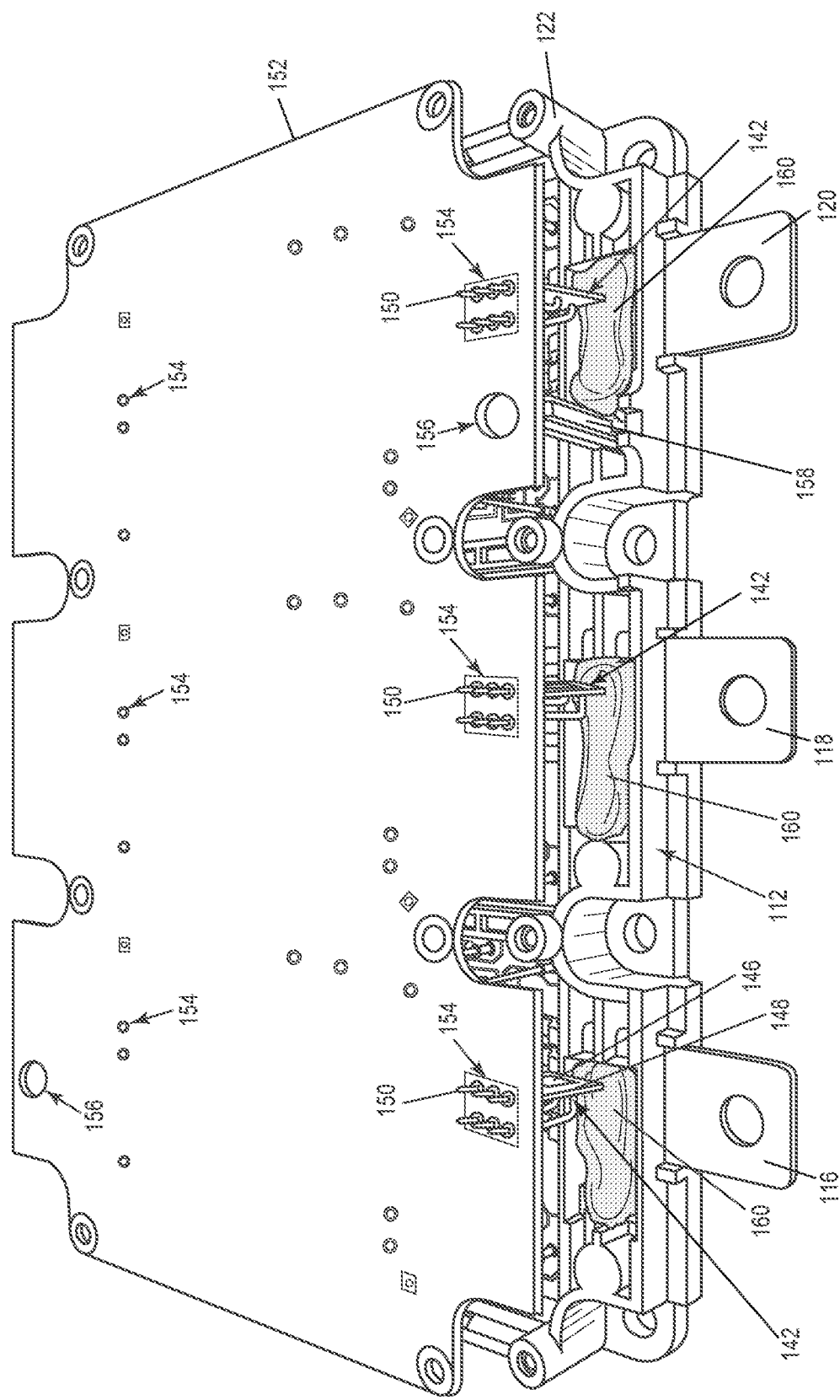

In FIG. 1B, a current sensor module 142 is prepared for being seated in a corresponding receptacle 144 of the frame 122 in sensing proximity of a corresponding phase busbar 116, 118, 120. Each current sensor module 142 includes a current sensor 146 such as a differential Hall sensor attached to a circuit board 148. Each current sensor module 142 may sense relatively high current, e.g., 500A or more and may have 2 Hall probes for measuring the magnetic field surrounding the corresponding busbar 116, 118, 120 via differential Hall sensing.

Connector pins (terminals) 150 extend away from the circuit board 148 to provide a point of external electrical connection for the current sensor 146. In one embodiment, the current sensor 146 includes a bare semiconductor die (chip) encased in a molding compound, the die including a differential sensor circuit such as a differential Hall sensor circuit. The current sensor 146 may be a surface mount device (SMD) without being subjected to an over-molding process.

A gauge 152 is provided for seating each current sensor module 142 in the corresponding frame receptacle 144. The gauge 152 has first openings 154 sized to accommodate the free end of the signal pins 136, 138, 140 attached to each substrate 102, 106, 110 and the free end of the connector pins 150 of each current sensor module 142, when the gauge 152 and frame 122 are pressed together. The gauge 152 may also have second openings 156 sized to accommodate alignment features 158 such as pins or posts extending from the frame 122 in the along the z-direction in FIG. 1B.

Each current sensor module 142 is seated in the corresponding frame receptacle 144 by securing the current sensor module 142 to the gauge 152 and then pressing the gauge 152 with each current sensor module 142 onto the frame 122 such that each current sensor module 142 is received by the corresponding frame receptacle 144 in sensing proximity of the respective phase busbar 116, 118, 120. The pressing of the gauge 152 is along the z-direction in FIG. 1B.

In one embodiment, the current sensor modules 142 are secured to the gauge 152 by inserting the connector pins 150 of each current sensor module 142 into corresponding ones of the first openings 154 in the gauge 152. During the pressing of the gauge 152 onto the frame 122, the signal pins 136 attached to the substrates 102, 106, 110 pass through corresponding ones of the first openings 154 in the gauge 152.

In FIG. 1B, the current sensor modules 142 have not been secured in place to the frame 122 at this stage of the module assembly process. This allows for movement of the current sensor modules 142 during current sensor module placement using the gauge 152. Accordingly, the current sensor modules 142 have freedom of movement during placement in the frame receptacles 144 which allows form a minimum pin-to-pin tolerance for the power semiconductor module. If the current sensor modules 142 had less or no freedom of movement during placement in the frame receptacles 144, the pin-to-pin tolerance would have to be relaxed in order to account for placement tolerances. For example, if the current sensor modules 142 were instead over-molded modules, additional placement tolerance must be accounted for when inserting such over-molded modules in the frame receptacles 144 which might lead to high mechanical stress and therefore problems over the module lifetime, e.g., in the form of cracks, delamination, etc. Current sensor modules 142 without overmolding provides additional freedom and are fixed in the correct position which may be a tilted position but with near zero mechanical strain.

In FIG. 10, each frame receptacle 144 is at least partly filled with a potting material 160 such as a thermosetting plastic, silicone rubber gel, epoxy resin, glue, etc. The frame receptacles 144 may be at least partly filled with the potting material 160 before insertion of the current sensor modules 142 as shown in FIG. 10, or after current sensor module insertion. For example, each frame receptacle 144 may be at least partly filled with an insulating liquid compound such as a uncured silicone potting material, an uncured epoxy material, etc. before or after the current sensor modules 142 are seated in the respective frame receptacles 144.

Figure 1D:
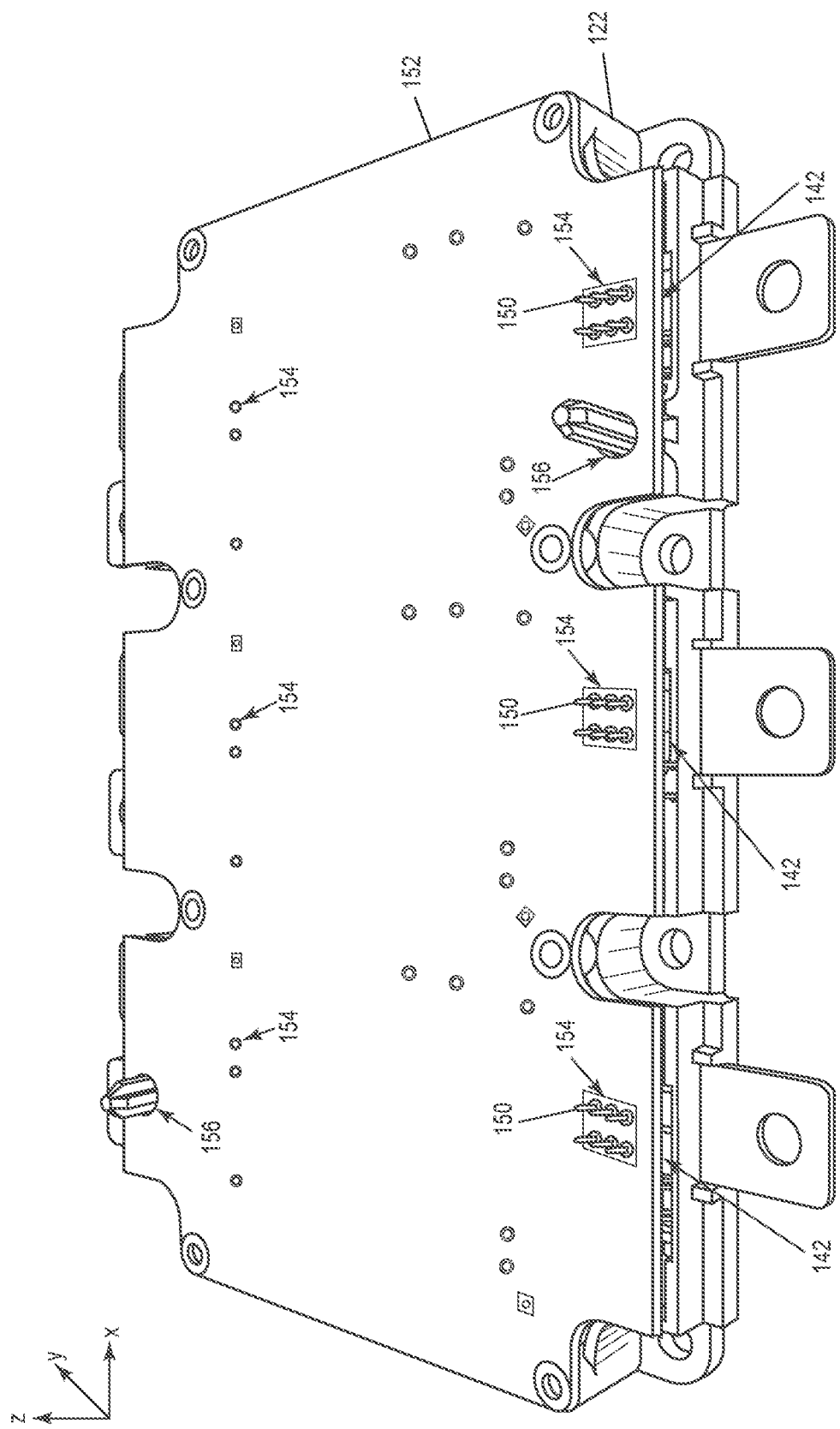

In FIG. 1D, each current sensor module 142 is fixed to the frame 122 with the potting material 160. The potting material 160 contacts both the frame 122 and the current sensor 146 of each current sensor module 142 such that no air gap is present between the current sensor 146 and the corresponding phase busbar 116, 118, 120. The manner by which the potting material 160 is hardened/cured depends on the type of material used. The insulating liquid compound used to form the potting material 160 is hardened while the gauge 152 remains fixed in place with each current sensor module 142 seated in the corresponding frame receptacle 144.

The potting material 160 fills the gap between the power module frame 122 and each current sensor 146, holding the current sensors 146 in place post sensor placement and with no air gap between frame 122 and the current sensor 146. The potting material 160 may also contact the circuit board 148 of the current sensor modules 142. After curing/hardening of the potting material 160, the current sensor modules 142 are fixed in place and do not move which improves sensor reading accuracy and performance. Eliminating any air gaps between the current sensor 146 and the corresponding phase busbar 116, 118, 120 provides improved isolation in that filling without an air gap means that it is solid material and not clearance creepage distance. Solid material distances are very narrow compared to clearance creepage. Solid material distances can be designed with respect to dielectric strength capability of the potting material 160. After the current sensor modules 142 are fixed in place, the current sensors 146 may be calibrated which may be done before shipment of the power semiconductor module.

Figure 1E:
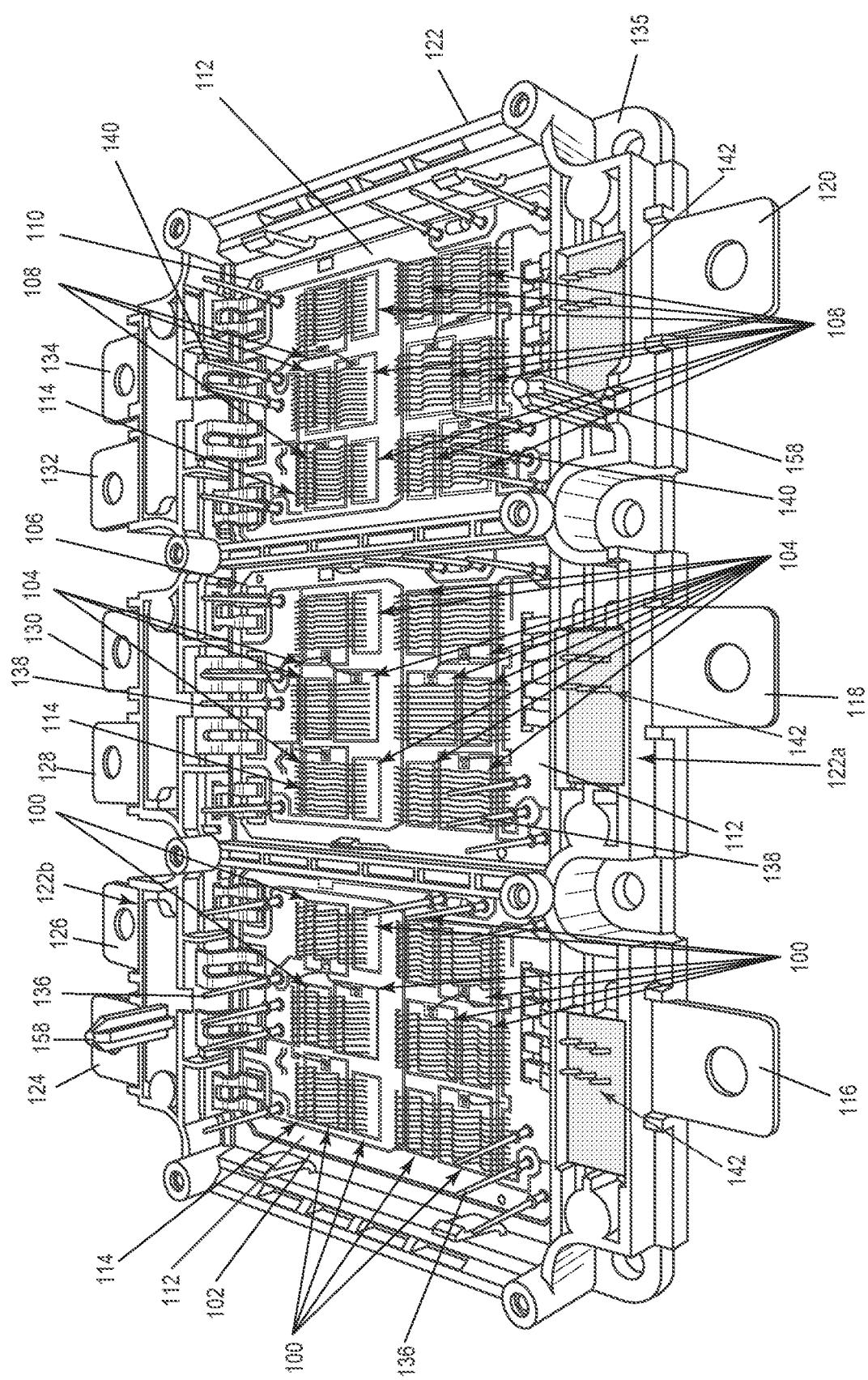

In FIG. 1E, the gauge 152 is removed from the power semiconductor module after each current sensor module 142 is fixed to the frame 122 with the potting material 160. According to this embodiment, the gauge 152 does not form part of the final semiconductor module. Thus, the material of the gauge 152 may be selected for surviving high production volume with low service requirement. In one embodiment, the gauge 152 is made of metal or a metal alloy. For example, the gauge 152 may be a steel plate.

Figure 2B:
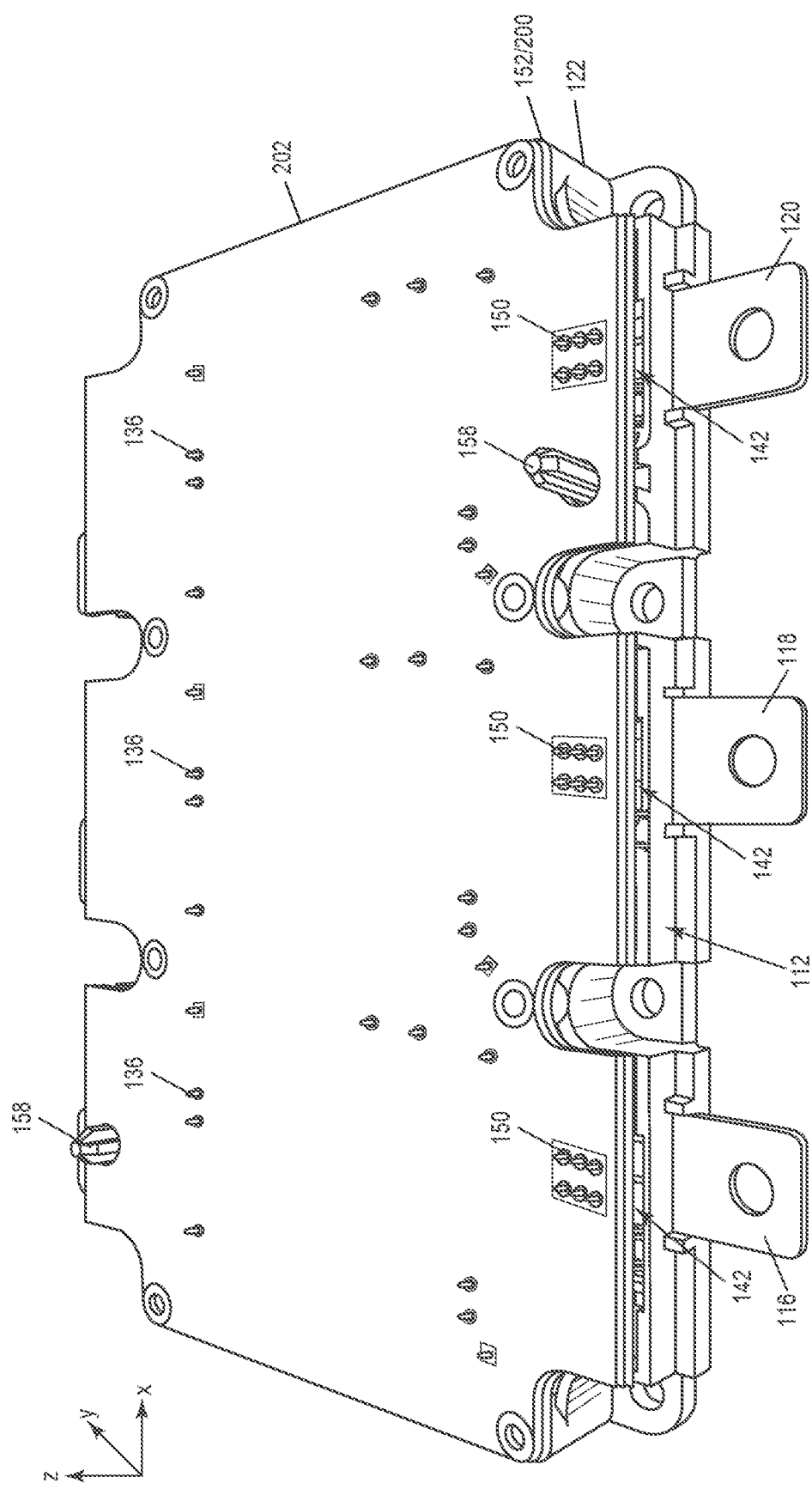

FIGS. 2A and 2B illustrate another embodiment of producing the power semiconductor module. According to this embodiment, the gauge 152 is not removed and forms a lid 200 of the power semiconductor module.

FIG. 2A corresponds to the same point in the module assembly process as FIG. 10. Different, however, the gauge 152 is not to be removed and instead forms a lid 200 of the power semiconductor module. In one embodiment, the gauge/lid 152, 200 comprises an electrically insulative laminate material or plastic. For example, the lid 200 may be an insulative PCB material without metal traces, vias, etc. (e.g., just FR4 material) to have the function of positioning sensors correctly and then to server as a lid. Separately or in combination, the gauge/lid 152, 200 may provide rerouting of electrical connections for the signal pins 136 attached to the substrates 102, 106, 110 seated in the frame 122. For example, either side of the gauge/lid 152, 200 may include metal traces (not shown) for rerouting the electrical connections for the signal pins 136.

FIG. 2A also shows a printed circuit board (PCB) 202 vertically aligned with the module assembly along the z-direction in FIG. 2A. The PCB 202 has first openings 204 sized to accommodate the free end of the signal pins 136, 138, 140 attached to each substrate 102, 106, 110 seated in the frame 122 of the power semiconductor module and the free end of the connector pins 150 of each current sensor module 142, when the gauge 152 and frame 122 of the module are pressed together. The PCB 202 may also have second openings 206 sized to accommodate the alignment features 158 of the module frame 122 along the z-direction in FIG. 2A.

In FIG. 2B, the PCB 202 is attached to the gauge/lid 152, 200 such that the connector pins 150 of the current sensor modules 142 and the signal pins 136 attached to each substrate 102, 106, 110 seated in the module frame 122 pass through respective ones of the first openings 154 in the gauge/lid 152, 200 and form press-fit connections with the corresponding first openings 204 of the PCB 202. The side of the PCB 202 facing away from the power semiconductor module may be configured for mounting of additional components like a controller, passive components such as inductors and capacitors, and other types of electrical components.

Figure 3:
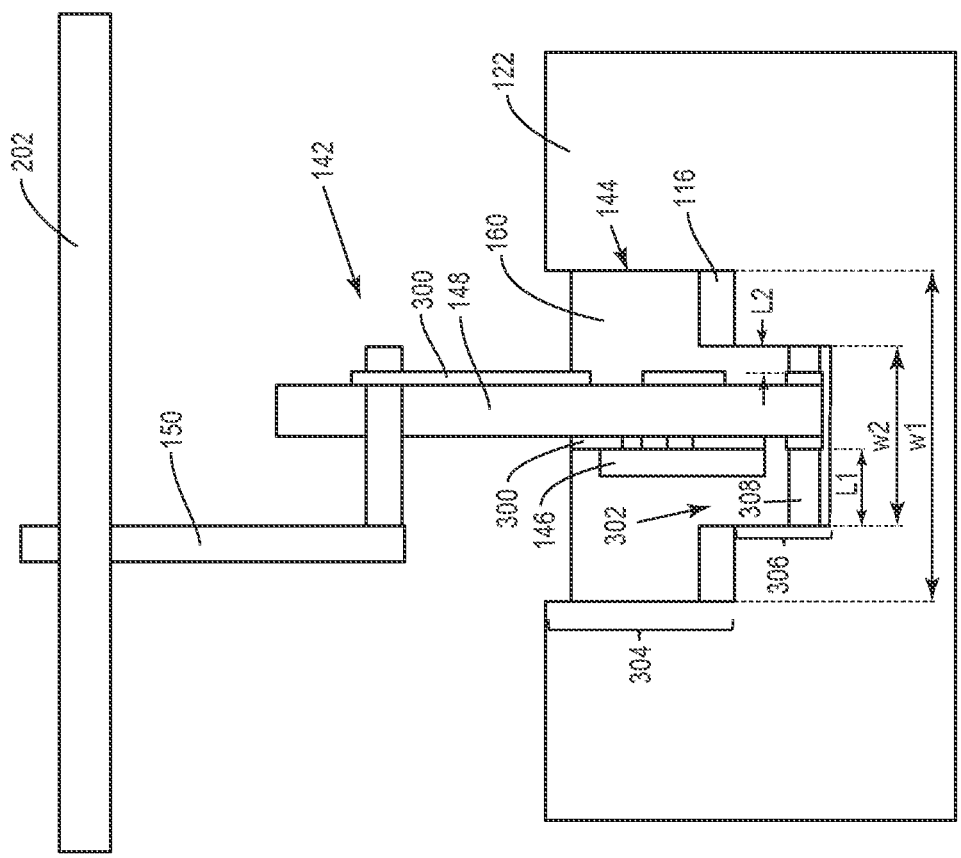
FIG. 3 illustrates a cross-sectional view in a region of a power semiconductor module where a current sensor module is seated in a receptacle of the module frame.

FIG. 3 illustrates a cross-sectional view in a region of the power semiconductor module where a current sensor module 142 is seated in a receptacle 144 of the module frame 122. As previously explained herein, the current sensor module 142 is seated in the frame receptacle 144 in sensing proximity of a busbar 116 and includes a current sensor 146 attached to a circuit board 148. The circuit board 148 may have metal traces 300 on one or both sides to provide electrical connections between the current sensor 146 and the connector pins 150 of the current sensor module 142.

The potting material 160 fixes the current sensor module 142 to the frame 122. The potting material 160 contacts both the frame 122 and the current sensor 146 such that no air gap is present between the current sensor 146 and the busbar 116.

In one embodiment, part of the current sensor module 142 is positioned in an opening 302 in the busbar 116. The potting material 160 fills the gap between the busbar 116 and the current sensor module 142 in the region of the busbar opening 302 such that no air gap is present between the current sensor 146 and the busbar 116 in the region of the opening 302.

Further according to the embodiment illustrated in FIG. 3, the frame receptacle 144 may include a first recessed region 304 in which the busbar 116 is seated and a second recessed region 306 below and narrower (w2<w1) than the first recessed region 304. The current sensor module 142 extends through the opening 302 in the busbar 116 and into the second (lower) recessed region 306 of the module frame 122.

An alignment structure 308 may be positioned in the second recessed region 306 of the module frame 122. The alignment structure 308 receives the circuit board 148 of the current sensor module 142 and sets a lateral distance L1, L2 between the current sensor module 142 and the busbar 116 in the region of the busbar opening 302.

Figure 4B:
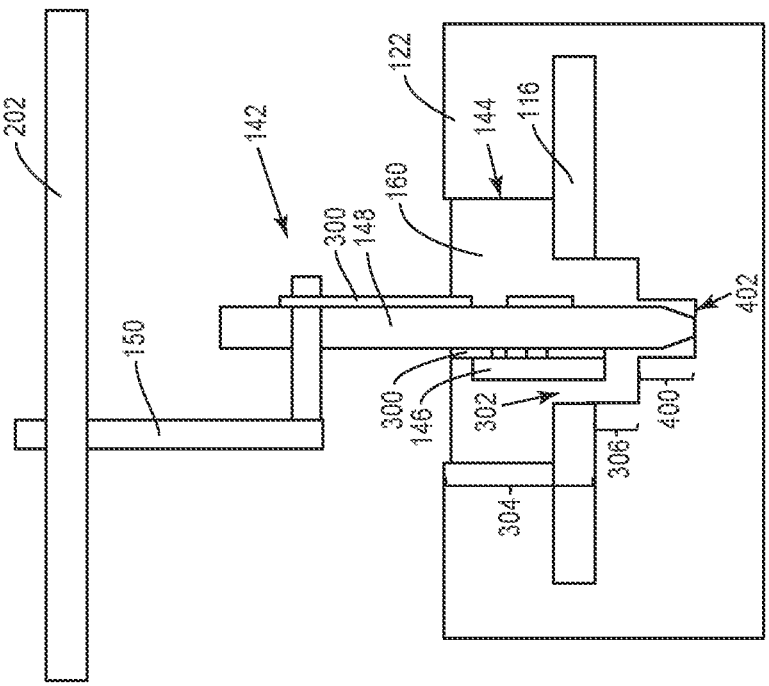
FIGS. 4A and 4B illustrate cross-sectional views in a region of a power semiconductor module where a current sensor module is seated in a receptacle of the module frame during the module assembly process, according to another embodiment.
Figure 4A:
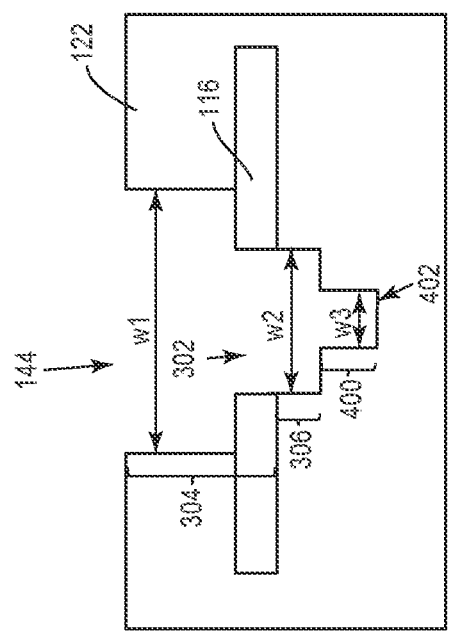

FIGS. 4A and 4B illustrate a cross-sectional view in a region of the power semiconductor module where a current sensor module 142 is seated in a receptacle 144 of the frame 122, according to another embodiment. FIG. 4A shows the region of the module frame 122 with the sensor receptacle 144 before seating of the current sensor module 142 in the frame receptacle 144.

Similar to the embodiment shown in FIG. 3, the frame receptacle 144 has a first recessed region 304 in which the busbar 116 is seated and a second recessed region 306 below and narrower (w2<w1) than the first recessed region 304. According to the embodiment illustrated in FIGS. 4A and 4B, the frame receptacle 144 further has a third recessed region 400 below and narrower (w3<w2) than the second recessed region 304.

In FIG. 4B, which shows the current sensor module 142 seated in the receptacle 144 and fixed to the frame 122 with the potting material 160, at least part of the current sensor 146 is positioned in the busbar opening 302. Also, the circuit board 148 of the current sensor module 142 extends through the busbar opening 302 and contacts the bottom 402 of the third recessed region 400 of the frame receptacle 144.

FIGS. 5A through 5G illustrate partial cross-sectional views of an embodiment of producing the power semiconductor module. Similar to the embodiment illustrated in FIGS. 1A through 1E, the gauge 152 used to insert current sensor modules 142 into corresponding receptacles 144 of the module frame 122 is removed after the current sensor modules 142 are fixed in place by the potting material 160 and therefore does not form part of the final power semiconductor module.

Figure 5C:
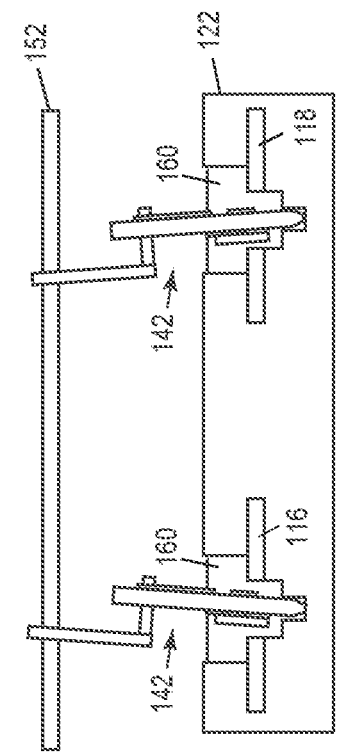
FIGS. 5A through 5G illustrate cross-sectional views of another embodiment of producing a power semiconductor module having current sensor modules fixed to the module frame.
Figure 5D:
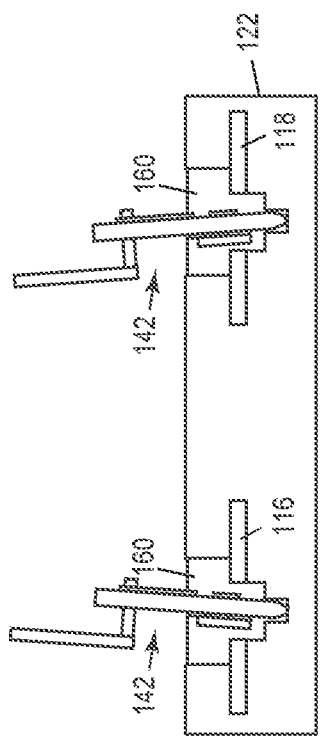
Figure 5A:
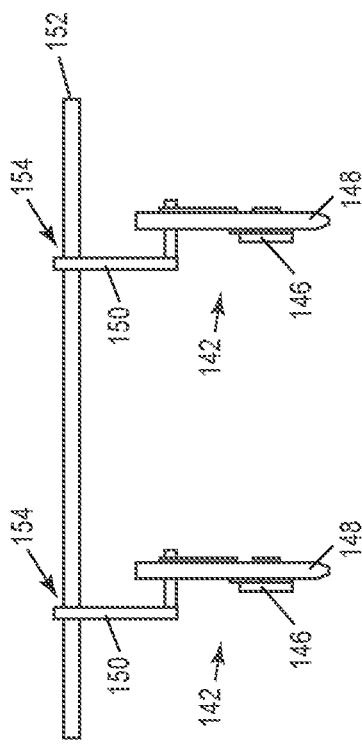

In FIG. 5A, the current sensor modules 142 are secured to the gauge 152. In one embodiment, the current sensor modules 142 are secured to the gauge 152 by inserting the connector pins 150 of each current sensor module 142 into corresponding openings 154 in the gauge 152 to form, e.g., press-fit connections.

Figure 5B:
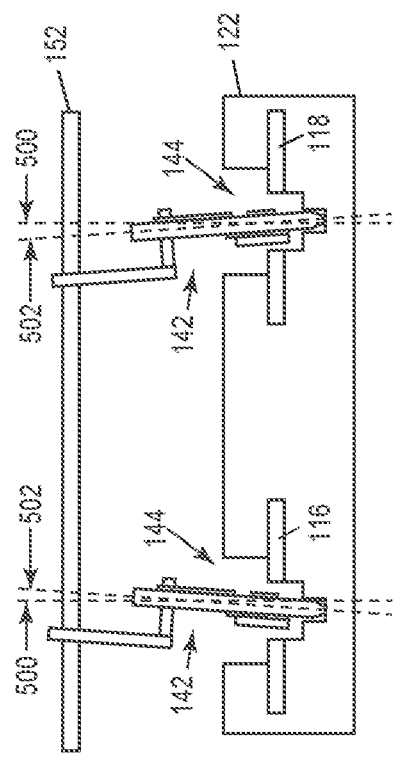

In FIG. 5B, the gauge 152 with the current sensor modules 142 is pressed onto the module frame 122 such that each current sensor module 142 is received by a corresponding frame receptacle 144 in sensing proximity of a busbar 116, 118. As shown in FIG. 5B, the current sensor modules 142 are not fixed in place at this point of the power module assembly process and therefore are free to rotate/tilt about a normal (vertical) axis 500 as indicated by the corresponding off-axis dashed lines 502. The rotation/tilt of the current sensor modules 142 provides position tolerance compensation. Accordingly, the connector pins 150 of each current sensor module 142 are positioned close to ideal as possible even though one or more of the current sensor modules 142 may have some permanent albeit slight off-axis tilt/rotation 502 relative to the normal axis 500.

In FIG. 5C, each current sensor module 142 is fixed to the module frame 122 with potting material 160. The potting material 160 contacts the frame 122 and each current sensor 146 such that no air gap is present between the current sensors 146 and the corresponding busbars 116, 118.

In FIG. 5D, the gauge 152 is removed from the power semiconductor module. The first openings 154 in the gauge 152 may be sized so as to temporarily secure the current sensor modules 142 via the respective connector pins 150 during the fixing process, and after the fixing process such that with a sufficient but not overly strong force the connector pins 150 of each current sensor module 142 are removed from the first openings 154. For example, the first openings 154 in the gauge 152 may be designed for press-fit connections with the current sensor module connector pins 150.

Figure 5F:
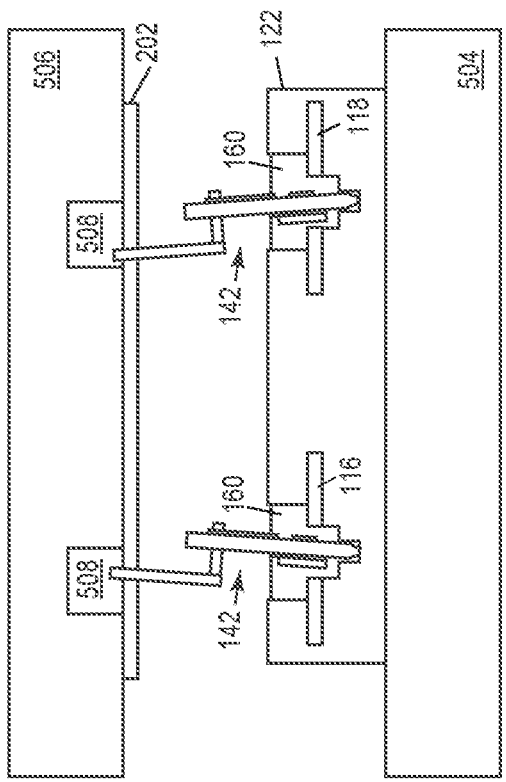
Figure 5G:
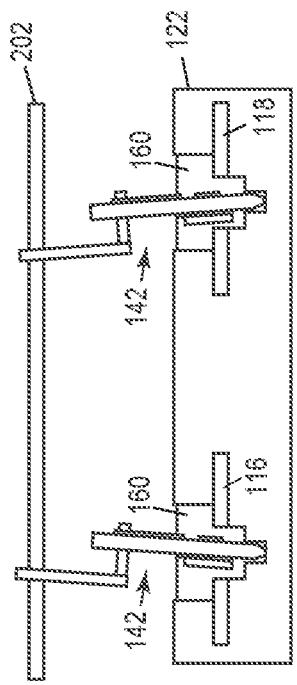
Figure 5E:
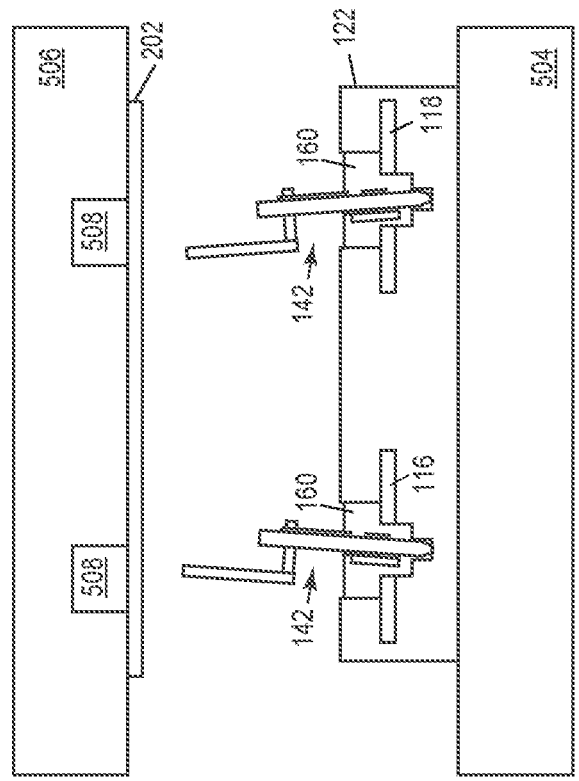

In FIG. 5E, the power semiconductor module is supported by a substrate 504 and a PCB 202 is aligned with the power semiconductor module using a jig or similar placement tool 506. The jig/placement tool 506 has receptacles 508 sized to accommodate the connector pins 150 of the current sensor modules 142 during subsequent attachment of the PCB 202 to the power semiconductor module.

In FIG. 5F, the PCB 202 is pressed toward the power semiconductor module via the jig/placement tool 506 such that the connector pins 150 of each current sensor module 142 form press-fit connections with the PCB 202. Out of view in FIG. 5F are the signal pins 136 attached to each substrate 102, 106, 110 of the power semiconductor module. The signal pins 136 similarly form press-fit connections with the PCB 202.

In FIG. 5G, the PCB 202 is attached to the power semiconductor module and the jig/placement tool 506 has been removed.

FIGS. 6A through 6D illustrate partial cross-sectional views of another embodiment of producing the power semiconductor module. The embodiment illustrated in FIGS. 6A through 6D is similar to the embodiment illustrated in FIGS. 5A through 5G. Different, however, the gauge 152 forms a permanent part of the final power semiconductor module, e.g., a lid 202.

Figure 6A:
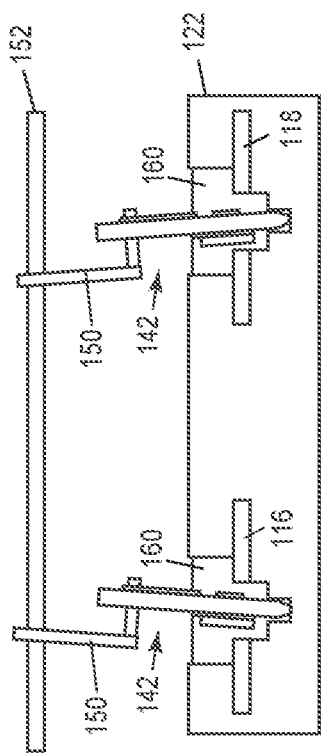

FIG. 6A corresponds to FIG. 5C, where each current sensor module 142 is fixed to the module frame 122 with potting material 160. The potting material 160 contacts the frame 122 and each current sensor 146 such that no air gap is present between the current sensors 146 and the corresponding busbars 116, 118.

Figure 6B:
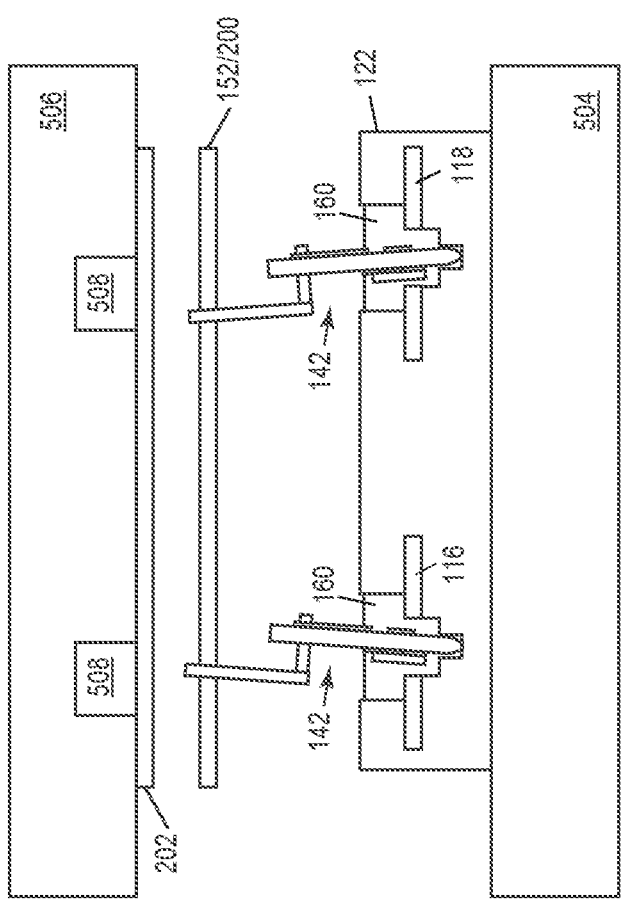

FIG. 6B corresponds to FIG. 5E. Different, however, the gauge 152 remains attached to the connector pins 150 of the current sensor modules 142. For example, the gauge 152 may form a lid 200 of the power semiconductor module.

FIG. 6C corresponds to FIG. 5F. Different, however, the PCB 202 is attached to the gauge/lid 152, 200 such that connector pins 150 of the current sensor modules 142 pass through respective first openings 154 in the gauge/lid 152, 200 and form press-fit connections with the PCB 202. Out of view in FIG. 6C are the signal pins 136 attached to each substrate 102, 106, 110 of the power semiconductor module. The signal pins 136 similarly pass through respective first openings 154 in the gauge/lid 152, 200 and form press-fit connections with the PCB 202.

FIG. 6D corresponds to FIG. 5G in that the jig/placement tool 506 has been removed, leaving the PCB 202 attached to the power semiconductor module but with the gauge 152 remaining as a lid 200. Although not shown in FIG. 6D, a distance keeper may be provided between the lid 200 and the PCB 202 to ensure a certain distance.

Figure 7:
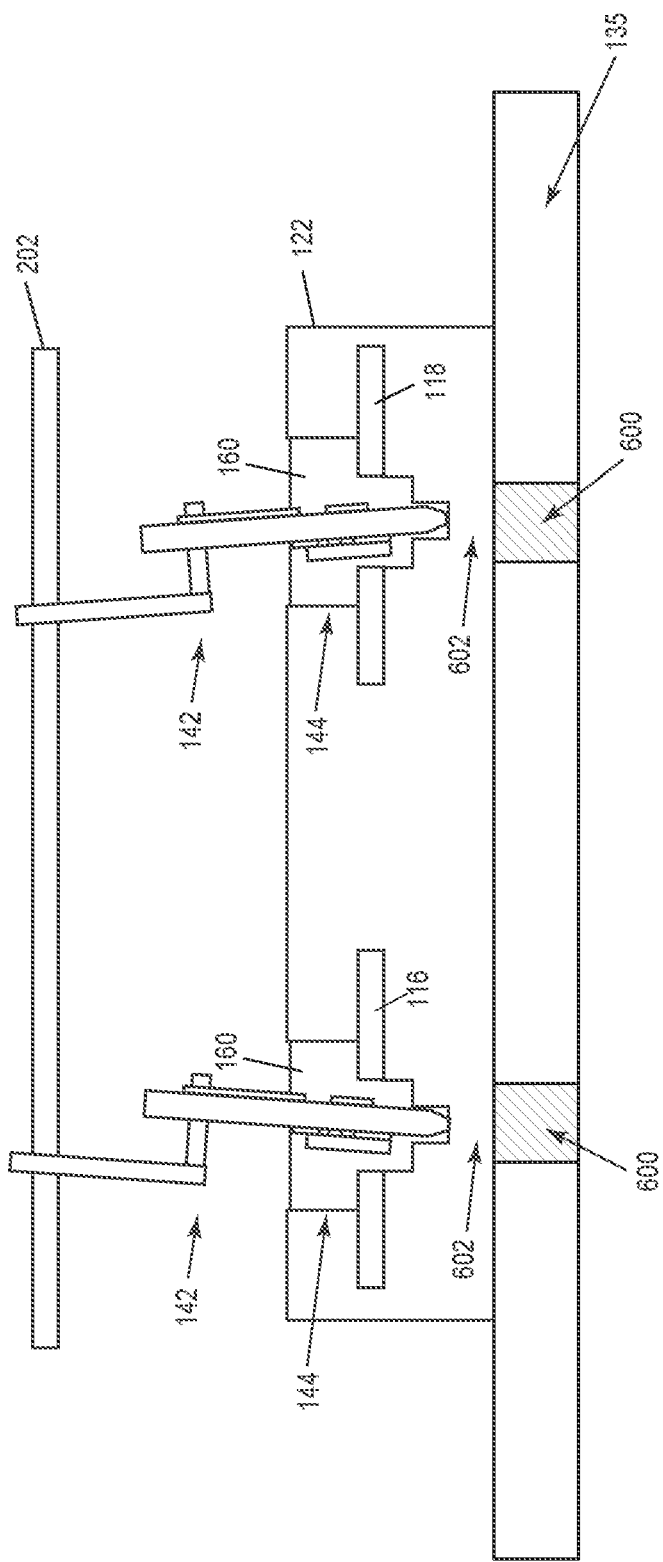
FIG. 7 illustrates a partial cross-sectional view of another embodiment of the power semiconductor module.

FIG. 7 illustrates another embodiment of the power semiconductor module. According to this embodiment, the baseplate 135 to which the frame 122 is attached may include openings 600 vertically aligned with the current sensors 146. As previously explained herein, the baseplate 135 may be grounded and therefore may comprise a metal or metal alloy. Metal material can distort the magnetic fields sensed by the current sensors 146. By forming openings 600 in the baseplate 135 that are vertically aligned with the current sensors 146, less metal material is available to distort the magnetic fields. The openings 600 in the baseplate 135 may have any form such as but not limited to round holes, rectangular cut-outs, etc.

The baseplate design with openings 600 may be particularly beneficial for higher operating frequencies. Also, the baseplate 135 may have no electrical or mechanical contact with the current sensors 146. For example, the receptacles 144 in the module frame 122 that receive the current sensors 146 may be closed above the baseplate 135 such that the potting material 160 does not leak from the frame receptacles 144 to the outside environment. Also, the closed area 602 of the module frame 122 avoids a clearance/creepage problem between the baseplate 135 and the phase busbars 116, 118, 120.

As previously described herein, the current sensors 146 described herein may be implemented as a differential Hall sensor. Each phase busbars 116, 118, 120 inputs or outputs a current 'U', 'W', etc. The current induces a magnetic field around the corresponding phase busbars 116, 118, 120. Each current sensor 146 senses the corresponding magnetic field and generates a signal which is proportional to the magnitude of the current flowing in the respective phase busbar 116, 118, 120.

Figure 8:
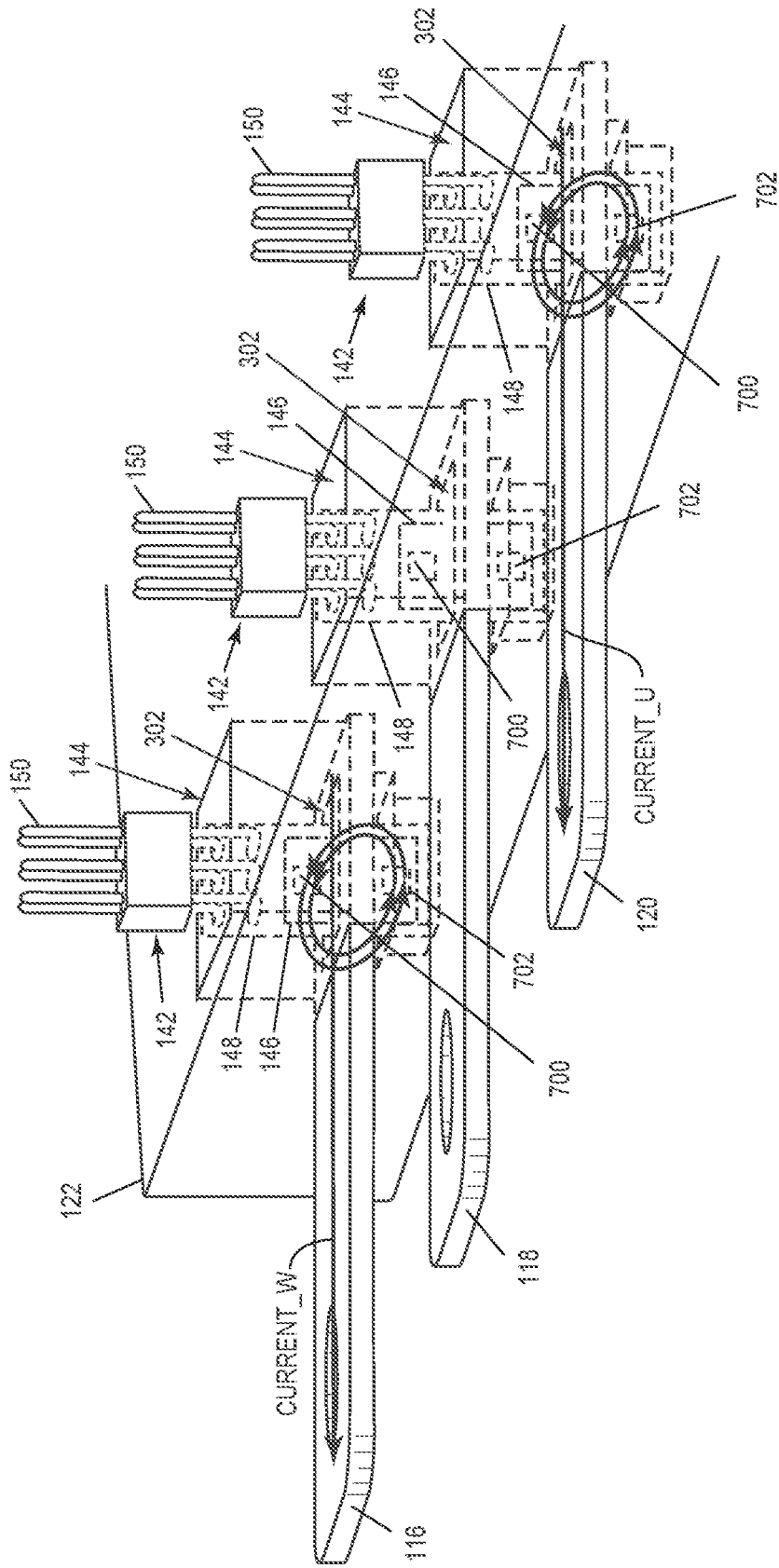
FIG. 8 illustrates a side perspective view of an embodiment in which the current sensors of the power semiconductor module are implemented as differential Hall sensors.

FIG. 8 illustrates an embodiment in which the current sensors 146 are implemented as differential Hall sensors. According to this embodiment, each current sensor 146 may include a first Hall sensor 700 positioned above the corresponding phase busbar 116, 118, 120 and a second Hall sensor 702 positioned below the corresponding phase busbar 116, 118, 120. The difference between the output of the two Hall sensors 700, 702 is proportional to the magnitude of the current flowing in the respective phase busbar 116, 118, 120. The differential Hall approach suppresses stray magnetic fields from the environment and other magnetic fields from adjacent phase busbars of other load terminals. The differential Hall approach may not use a core (field concentrator), i.e., the current sensors 146 may be coreless.

As previously described herein, the power semiconductor module may be designed for use as a DC/AC inverter, a DC/DC converter, an AC/DC converter, a DC/AC converter, an AC/AC converter, or the like.

Figure 9:
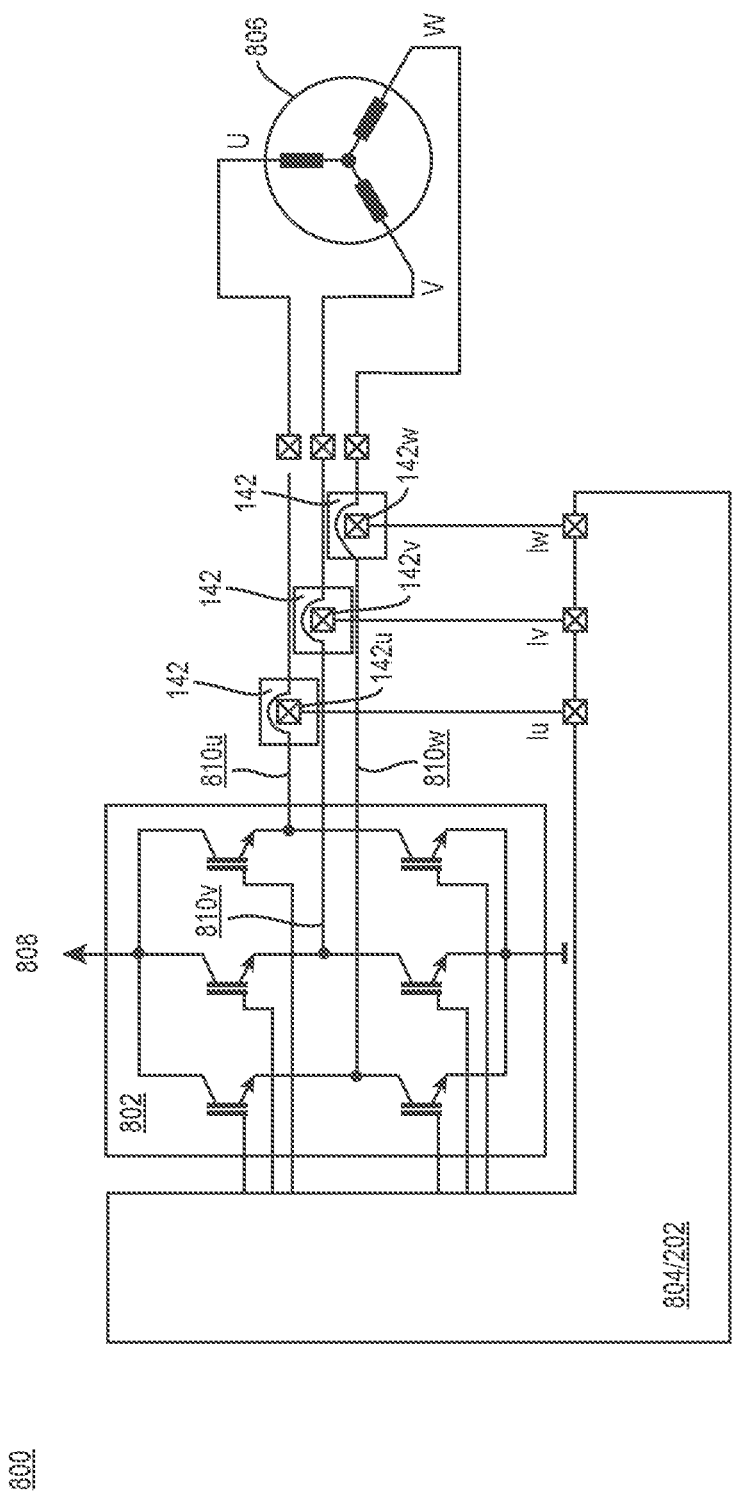
FIG. 9 illustrates a schematic diagram of a motor control loop for a power semiconductor module having a current sensor module attached to the module frame for each phase of the system.

FIG. 9 illustrates a schematic diagram of a motor control loop 800 for a power semiconductor module of the kind described herein and that includes a current sensor module 142 for each phase of the system. Each current sensor module 142 is fixed to the frame 122 of the power semiconductor module as described herein.

The motor control loop 800 may include a power semiconductor module 802 of the kind described herein, a current sensor module 142 for each phase of the system, and a control board 804 which may correspond to the PCB 202 described herein. As shown, the motor control loop 800 may be further coupled to a three-phase motor 806 that includes three phases U, V, and W. While the example of FIG. 9 shows the power semiconductor module 802 implemented as a three-phase current generator configured to provide three-phase power by supplying three phase currents to drive the motor 806, other implementations are possible.

In this example, the power semiconductor module 802 is coupled to a power supply 808 (e.g., a battery) and configured to regulate and supply a current to an output current rail for each phase of the motor 806. As such, the power semiconductor module 802 includes three output current rails. In some implementations, the power semiconductor module 802 may include a separate driver circuit for each output, where each driver circuit is configured to generate an output current that is provided to a corresponding current rail. In this example, the power semiconductor module 802 may include three driver circuits.

For the purpose of illustration, each current rail is represented as a current path 810 (e.g., current paths 810*u*, 810*v*, and 810*w* are shown in FIG. 9), and each current path 810 is coupled between an output of the power semiconductor module 802 and a corresponding phase of the motor 806. The outputs of the power semiconductor module 802 may correspond to the phase busbars 116, 118, 120 shown in the prior figures.

As shown in FIG. 9, current sensor modules 142 (e.g., current sensor modules 142*u*, 142*v*, and 142*w* are shown in FIG. 9) are coupled to respective current paths 810 and provide corresponding sensed current signals (e.g., sensed currents Iu, Iv, and Iw are shown in FIG. 9) to the control board 804 for analysis/processing. Each current sensor module 142 is inserted into the frame 122 of the power semiconductor module 802 during assembly of the power semiconductor module 802 according to any of the assembly processes described herein.

Although the present disclosure is not so limited, the following numbered examples demonstrate one or more aspects of the disclosure.

Example 1. A power semiconductor module, comprising: a frame comprising an electrically insulative material; a first substrate seated in the frame; a plurality of power semiconductor dies attached to the first substrate; a plurality of signal pins attached to the first substrate and electrically connected to the power semiconductor dies; a busbar extending from the first substrate through a side face of the frame; a current sensor module seated in a receptacle of the frame in sensing proximity of the busbar, the current sensor module comprising a current sensor attached to a circuit board; and a potting material fixing the current sensor module to the frame such that no air gap is present between the current sensor and the busbar, wherein the potting material contacts the frame and the current sensor.

Example 2. The power semiconductor module of example 1, wherein part of the current sensor module is positioned in an opening in the busbar, and wherein the potting material fills a gap between the busbar and the current sensor module in a region of the opening such that no air gap is present between the current sensor and the busbar in the region of the opening.

Example 3. The power semiconductor module of example 1 or 2, wherein the receptacle comprises a first recessed region in which the busbar is seated and a second recessed region below and narrower than the first recessed region, and wherein the current sensor module extends through an opening in the busbar and into the second recessed region of the frame.

Example 4. The power semiconductor module of example 3, wherein an alignment structure is positioned in the second recessed region of the frame, and wherein the alignment structure receives the circuit board of the current sensor module and sets a lateral distance between the current sensor module and the busbar in a region of the opening.

Example 5. The power semiconductor module of any of examples 1 through 4, wherein the receptacle comprises a first recessed region in which the busbar is seated, a second recessed region below and narrower than the first recessed region, and a third recessed region below and narrower than the second recessed region, wherein at least part of the current sensor is positioned in an opening in the busbar, and wherein the circuit board of the current sensor module extends through the opening in the busbar and contacts a bottom of the third recessed region of the receptacle.

Example 6. The power semiconductor module of any of examples 1 through 5, wherein the power semiconductor dies form a multi-phase inverter, wherein a busbar for each phase of the multi-phase inverter extends through a side face of the frame, and wherein for each busbar, a current sensor module is seated in a receptacle of the frame in sensing proximity of the busbar and fixed to the frame by the potting material without an air gap between the current sensor module and the busbar.

Example 7. The power semiconductor module of any of examples 1 through 6, wherein the current sensor is a differential Hall sensor comprising a first Hall sensor positioned above the busbar and a second Hall sensor positioned below the busbar.

Example 8. The power semiconductor module of any of examples 1 through 7, wherein the current sensor is a coreless current sensor.

Example 9. The power semiconductor module of any of examples 1 through 8, further comprising a metal baseplate to which the frame is attached, wherein the metal baseplate has an opening vertically aligned with the current sensor.

Example 10. A method of producing a power semiconductor module, the method comprising: attaching a plurality of power semiconductor dies to a first substrate; attaching a plurality of signal pins to the first substrate and that are electrically connected to the power semiconductor dies; seating the first substrate in a frame that comprises an electrically insulative material and such that a busbar extends from the first substrate through a side face of the frame; seating a current sensor module in a receptacle of the frame in sensing proximity of the busbar, the current sensor module comprising a current sensor attached to a circuit board; and fixing the current sensor module to the frame with a potting material such that no air gap is present between the current sensor and the busbar, wherein the potting material contacts the frame and the current sensor.

Example 11. The method of example 10, wherein seating the current sensor module in the receptacle of the frame in sensing proximity of the busbar comprises: securing the current sensor module to a gauge; and pressing the gauge with the current sensor module onto the frame such that the current sensor module is received by the receptacle in sensing proximity of the busbar.

Example 12. The method of example 11, further comprising: after fixing the current sensor module to the frame with the potting material, removing the gauge from the power semiconductor module.

Example 13. The method of example 12, wherein the gauge is made of metal or a metal alloy.

Example 14. The method of example 11, wherein the gauge is not removed and forms a lid of the power semiconductor module.

Example 15. The method of example 14, wherein the gauge comprises an electrically insulative laminate material or plastic.

Example 16. The method of example 14 or 15, further comprising: attaching a printed circuit board to the gauge such that connector pins of the current sensor module and the signal pins attached to the first substrate pass through openings in the gauge and form press-fit connections with the printed circuit board.

Example 17. The method of any of examples 14 through 16, wherein the gauge provides rerouting of electrical connections for the signal pins attached to the first substrate.

Example 18. The method of any of examples 11 through 17, wherein securing the current sensor module to the gauge comprises: inserting connector pins of the current sensor module into openings in the gauge.

Example 19. The method of any of examples 11 through 18, wherein during the pressing of the gauge onto the frame, the signal pins attached to the first substrate pass through openings in the gauge.

Example 20. The method of any of examples 11 through 19, wherein fixing the current sensor module to the frame with the potting material comprises: at least partly filling the receptacle of the frame with an insulating liquid compound before or after the current sensor module is seated in the receptacle; and hardening the insulating liquid compound while the gauge remains fixed in place with the current sensor module seated in the receptacle.

Example 21. A method of producing a power semiconductor module, the method comprising: attaching a plurality of power semiconductor dies to one or more substrates, the power semiconductor dies forming a multi-phase inverter; attaching a plurality of signal pins to the one or more substrates and that are electrically connected to the power semiconductor dies; seating the one or more substrates in a frame that comprises an electrically insulative material and such that a busbar for each phase of the multi-phase inverter extends through a side face of the frame; seating a plurality of current sensor modules in receptacles of the frame, each current sensor module being in sensing proximity of one of the busbars and comprising a current sensor attached to a circuit board; and fixing the current sensor modules to the frame with a potting material such that no air gap is present between each current sensor and the corresponding busbar, wherein the potting material contacts the frame and the current sensors.

Example 22. The method of example 21, wherein seating the current sensor modules in the receptacles of the frame comprises: securing the current sensor modules to a gauge; and pressing the gauge with the current sensor modules onto the frame such that each current sensor module is received by one of the receptacles of the frame in sensing proximity of the corresponding busbar.

Example 23. The method of example 22, further comprising: after fixing the current sensor modules to the frame with the potting material, removing the gauge from the power semiconductor module.

Example 24. The method of example 22, further comprising: attaching a printed circuit board to the gauge such that connector pins of the current sensor modules and the signal pins attached to the one or more substrates pass through openings in the gauge and form press-fit connections with the printed circuit board.

Example 25. The method of any of examples 22 through 24, wherein fixing the current sensor modules to the frame with the potting material comprises: at least partly filling the receptacles of the frame with an insulating liquid compound before or after the current sensor modules are seated in the receptacles; and hardening the insulating liquid compound while the gauge remains fixed in place with the current sensor modules seated in the receptacles.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module, comprising:
   a frame comprising an electrically insulative material;
   a first substrate seated in the frame;
   a plurality of power semiconductor dies attached to the first substrate;
   a plurality of signal pins attached to the first substrate and electrically connected to the power semiconductor dies;
   a busbar extending from the first substrate through a side face of the frame;
   a current sensor module seated in a receptacle of the frame in sensing proximity of the busbar, the current sensor module comprising a current sensor attached to a circuit board; and
   a potting material fixing the current sensor module to the frame such that no air gap is present between the current sensor and the busbar,
   wherein the potting material contacts the frame and the current sensor.

2. The power semiconductor module of claim 1, wherein part of the current sensor module is positioned in an opening in the busbar, and wherein the potting material fills a gap between the busbar and the current sensor module in a region of the opening such that no air gap is present between the current sensor and the busbar in the region of the opening.

3. The power semiconductor module of claim 1, wherein the receptacle comprises a first recessed region in which the busbar is seated and a second recessed region below and narrower than the first recessed region, and wherein the current sensor module extends through an opening in the busbar and into the second recessed region of the frame.

4. The power semiconductor module of claim 3, wherein an alignment structure is positioned in the second recessed region of the frame, and wherein the alignment structure receives the circuit board of the current sensor module and sets a lateral distance between the current sensor module and the busbar in a region of the opening.

5. The power semiconductor module of claim 1, wherein the receptacle comprises a first recessed region in which the busbar is seated, a second recessed region below and narrower than the first recessed region, and a third recessed region below and narrower than the second recessed region, wherein at least part of the current sensor is positioned in an opening in the busbar, and wherein the circuit board of the current sensor module extends through the opening in the busbar and contacts a bottom of the third recessed region of the receptacle.

6. The power semiconductor module of claim 1, wherein the power semiconductor dies form a multi-phase inverter, wherein a busbar for each phase of the multi-phase inverter extends through a side face of the frame, and wherein for each busbar, a current sensor module is seated in a receptacle of the frame in sensing proximity of the busbar and fixed to the frame by the potting material without an air gap between the current sensor module and the busbar.

7. The power semiconductor module of claim 1, wherein the current sensor is a differential Hall sensor comprising a first Hall sensor positioned above the busbar and a second Hall sensor positioned below the busbar.

8. The power semiconductor module of claim 1, wherein the current sensor is a coreless current sensor.

9. The power semiconductor module of claim 1, further comprising a metal baseplate to which the frame is attached, wherein the metal baseplate has an opening vertically aligned with the current sensor.

* * * * *